(12) United States Patent
Penney et al.

(10) Patent No.: US 11,144,241 B2
(45) Date of Patent: *Oct. 12, 2021

(54) WRITE LEVELING A MEMORY DEVICE

(71) Applicant: Micron Technology, Inc., Boise, ID (US)

(72) Inventors: Daniel B. Penney, Wylie, TX (US); Liang Chen, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 20 days.

This patent is subject to a terminal disclaimer.

(21) Appl. No.: 16/534,846

(22) Filed: Aug. 7, 2019

(65) Prior Publication Data

US 2019/0391763 A1 Dec. 26, 2019

Related U.S. Application Data

(63) Continuation of application No. 16/019,116, filed on Jun. 26, 2018, now Pat. No. 10,452,319.

(51) Int. Cl.
| | |
|---|---|
| G06F 3/06 | (2006.01) |
| G11C 11/40 | (2006.01) |
| G11C 11/4096 | (2006.01) |
| G11C 11/408 | (2006.01) |
| G11C 11/4076 | (2006.01) |

(52) U.S. Cl.
CPC .......... *G06F 3/0659* (2013.01); *G06F 3/0611* (2013.01); *G06F 3/0673* (2013.01); *G11C 11/4076* (2013.01); *G11C 11/4087* (2013.01); *G11C 11/4096* (2013.01)

(58) Field of Classification Search
CPC .. G06F 11/4076; G06F 3/0611; G06F 3/0673; G06F 3/0659; G06F 11/4087; G06F 11/4096
See application file for complete search history.

(56) References Cited

U.S. PATENT DOCUMENTS

| | | | |
|---|---|---|---|
| 9,432,179 B2 * | 8/2016 | Stott | H04L 7/0041 |
| 9,672,884 B1 * | 6/2017 | Han | G11C 7/1093 |
| 10,332,575 B2 * | 6/2019 | Penney | G11C 7/109 |
| 10,360,951 B1 * | 7/2019 | Penney | G11C 29/028 |

(Continued)

OTHER PUBLICATIONS

K. Lee et al., "A 1.5-V 3.2 Gb/s/pin Graphic DDR4 SDRAM With Dual-Clock System, Four-Phase Input Strobing, and Low-Jitter Fully Analog DLL," in IEEE Journal of Solid-State Circuits, vol. 42, No. 11, pp. 2369-2377, Nov. 2007.*

*Primary Examiner* — Pierre Miche Bataille
(74) *Attorney, Agent, or Firm* — Fletcher Yoder, P.C.

(57) ABSTRACT

A host device and memory device function together to perform internal write leveling of a data strobe with a write command within the memory device. The memory device includes a command interface configured to receive write commands from the host device. The memory device also includes an input-output interface configured to receive the data strobe from the host device. The memory device also includes internal write circuitry configured to launch an internal write signal based at least in part on the write commands. The launch of the internal write signal is based at least in part on an indication from the host device that indicates when to launch the internal write signal relative to a cas write latency (CWL) for the memory device.

19 Claims, 7 Drawing Sheets

(56) References Cited

U.S. PATENT DOCUMENTS

| | | | |
|---|---|---|---|
| 2008/0002484 A1 | 1/2008 | Cho | |
| 2014/0192583 A1* | 7/2014 | Rajan | G11C 5/06 365/63 |
| 2015/0049558 A1 | 2/2015 | Kwak | |
| 2015/0340072 A1* | 11/2015 | Mazumder | G11C 7/1093 365/189.05 |
| 2017/0140808 A1* | 5/2017 | Jung | G11C 7/227 |
| 2018/0012638 A1 | 1/2018 | Kang et al. | |

* cited by examiner

WRITE LEVELING A MEMORY DEVICE

CROSS-REFERENCE TO RELATED APPLICATIONS

This application is a continuation of U.S. patent application Ser. No. 16/019,116, filed on Jun. 26, 2018, which is incorporated by reference herein in its entirety for all purposes.

BACKGROUND

Field of the Present Disclosure

Embodiments of the present disclosure relate generally to the field of semiconductor devices. More specifically, embodiments of the present disclosure relate to determining when to launch an internal write signal using internal write leveling in memory devices.

Description of Related Art

Semiconductor devices (e.g., memory devices) utilize timing with phase shifts of data signals, data strobes, and/or other signals to perform operations. Data strobes are used to capture data. To ensure that the data strobe signals are timed properly to capture data signals in, write leveling may be used to adjust timing for the data strobe signals to ensure that the data signals are captured properly.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, to ensure that the data strobe (DQS) signals are timed properly to capture data signals (DQ), write leveling may be used to adjust the DQS signals. In some embodiments, write leveling may be employed at powerup of a memory device, during a clock change, and/or due to system-level decisions (e.g., when too much variation occurs on clocking and clocking is reset). Write leveling may be classified as external write leveling and/or internal write leveling. External write leveling includes sending signals back to a host device telling the host device whether the DQS signals were able to be used to capture DQ signals. If the DQS signals do not enable proper capture of the DQ signals, the host device may shift the DQS signals until the DQS signals are able to capture the DQ signals.

Internal write leveling utilizes internal write signal (IWS) circuitry to launch the IWS after a write is received from the host device and may be performed using instructions from the host device. The internal write leveling causes the launch to occur some number (N) of cycles earlier than a programmed CAS Write Latency (CWL) for the memory device to ensure that the internal DQS signal may capture the IWS properly. Thus earlier launch may be used to attempt to offset the DQS signal path being inherently much faster than the IWS path. Thus, the IWS circuitry launches the IWS earlier than the CWL. For example if CWL is programmed to 28 cycles, then the IWS would nominally be launched 28 cycles after the external write command enters the memory device. However, without adjustment, the IWS may be late with respect to the internal DQS signal that captures the IWS. Thus, as described below, the IWS may be released early as calculated by the IWS circuitry. Alternatively, the internal DQS signal may be artificially delayed to match the IWS, but this artificial delay may increase power consumption in the memory device relative to the implementation that launches the IWS earlier than the CWL rather than delaying the internal DQS signal. In some embodiments, the early launching of the IWS may be performed internally to the memory device using the IWS circuitry.

Figure 1:
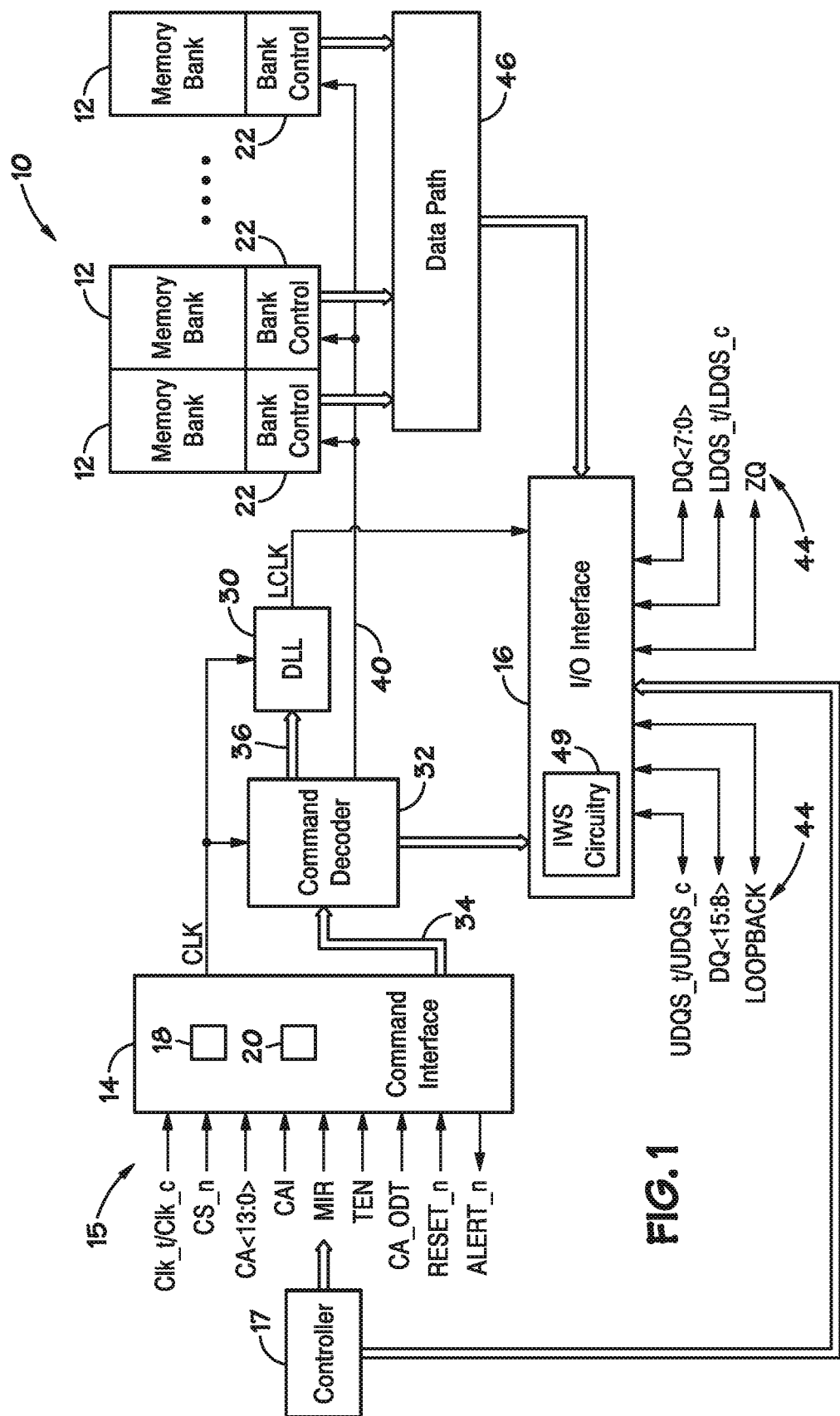
FIG. 1 is a simplified block diagram illustrating certain features of a memory device having internal write signal (IWS) circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (110) interface 16. The command interface 14 is configured to provide a number of signals (e.g., signals 15) from an external device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. To ensure that the DQS signals are timed properly to capture DQ signals in the memory device 10, write leveling may be used to adjust the DQS signals. In some embodiments, write leveling may be employed at powerup of the memory device 10, during a clock change, and/or due to system-level decisions (e.g., when too much variation occurs on clocking and clocking is reset). Write leveling may be divided into external write leveling and internal write leveling. External write leveling includes the memory device 10 sending signals back to the controller 17 telling the controller 17 whether the DQS signals were able to be used to capture DQ signals. If not, the controller 17 may shift the DQS signals under the DQS signals are able to capture the DQ signals.

Internal write leveling is performed entirely on the memory device 10 with instructions from the controller 17. Internal write leveling utilizes IWS circuitry 49 to launch the IWS to occur some number (N) of cycles earlier than the programmed CWL for the memory device 10 to ensure that the internal DQS signal may capture the IWS. As previously noted, the DQS signal is inherently much faster than the IWS. Thus, the IWS circuitry 49 launches the IWS earlier than the CWL. For example if CWL is programmed to 28 cycles, then the IWS would nominally be launched 28 cycles after the external write command enters the memory device. However, without adjustment, the IWS may be late with respect to the internal DQS signal that captures the IWS. Thus, as described below, the IWS is released early using determinations from the IWS circuitry 49. Alternatively, the internal DQS signal may be artificially delayed to match the IWS, but this artificial delay may increase power consumption in the memory device 10 relative to an implementation that launches the IWS earlier than the CWL. In some embodiments, the early launching of the IWS may be in the memory device 10 using the IWS circuitry 49 using instructions from the controller 17.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
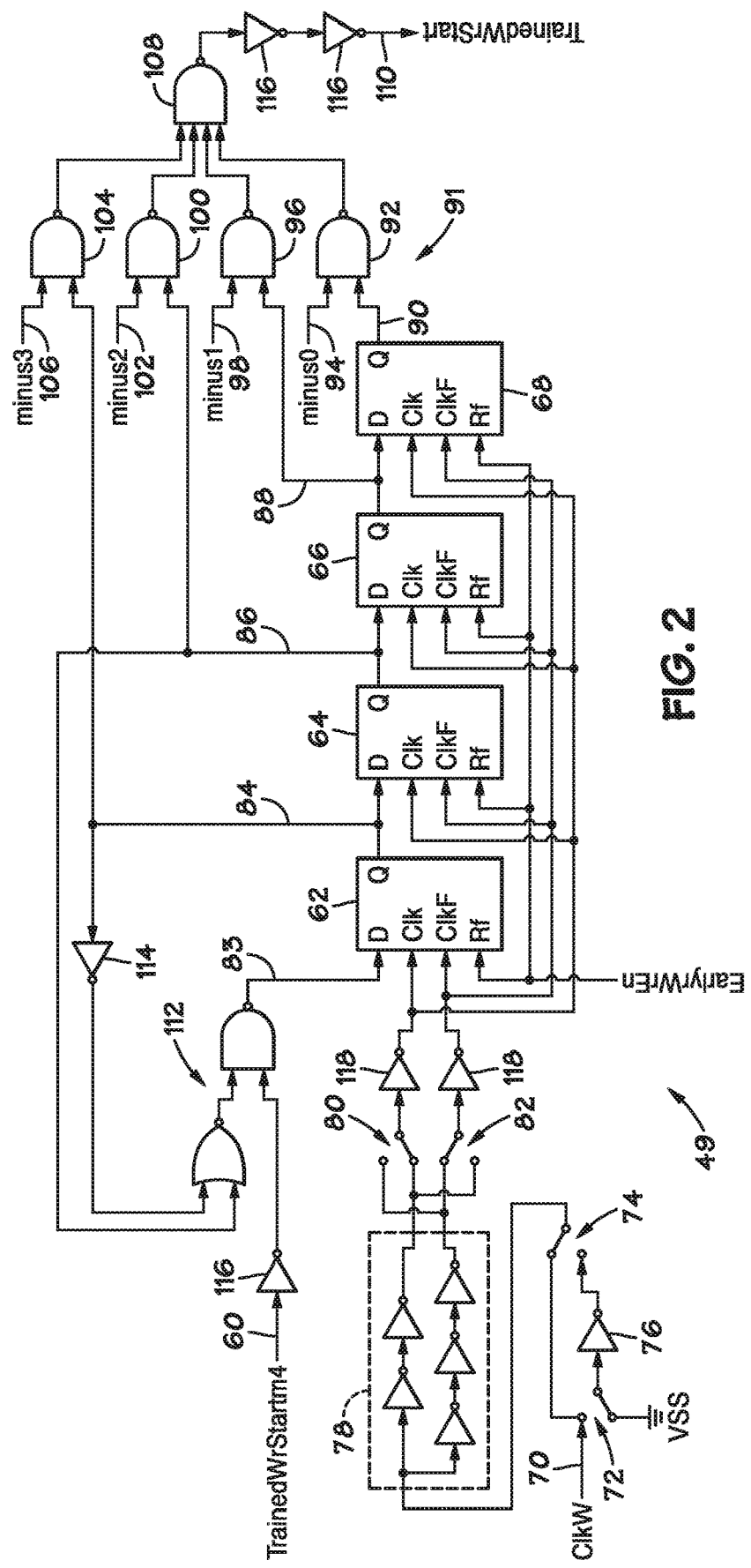
FIG. 2 is a schematic diagram of the IWS circuitry of FIG. 1, in accordance with an embodiment.

FIG. 2 illustrates a schematic diagram of an embodiment of the IWS circuitry 49 that receives a TrainedWrStartm4 signal 60 that is an IWS that exits a cas write latency (CWL) shifter 4 cycles earlier than the CWL (i.e., CWL minus 4). The TrainedWrStartm4 signal 60 is then programmatically delayed using flip-flops 62, 64, 66, and 68, where each flip-flop 62, 64, 66, and 68 sequentially shifts the TrainedWrStartm4 signal 60 using a ClkW 70. In some embodiments, the number of flip-flops included in the IWS circuitry 49 may be some number (and the number of cycles short of CWL used as an input to the IWS circuitry 49) other than four as long as the number of flip-flops is sufficient to shift the input IWS by a number of cycles sufficient to cause an output to occur at CWL. In other words, the number of flip-flops in the IWS circuitry 49 is equal to a number of cycles short of CWL in the TrainedWrStartm4 signal 60.

The IWS circuitry 49 includes switches 72 and 74 and an inverter 76 that together enables adjustment to center timing of the ClkW 70 or bypass the inverter 76 using the switches 72 and 74. The IWS circuitry 49 also includes a phase splitter 78 to generate clock and clock bar signals from the ClkW 70. For example, the IWS circuitry 49 may include one or more inverters to generate the clock and clock bar signals. The IWS circuitry 49 also includes switches 80 and 82 to control which of the clock or clock bar signals is routed to Clk and Clkf pins of the flip-flops 62, 64, 66, and 68.

The output of each flip-flop is shifted through to a next flip-flop on a pulse of the ClkW 70. Thus, an input 83 to the flip-flop 62 is output as signal 84 on a pulse of the ClkW 70. Similarly, the signal 84 is input to the flip-flop 64 that outputs the signal 84 as signal 86 on a pulse of the ClkW 70. Moreover, the signal 86 is input to the flip-flop 66 that outputs the signal 86 as signal 88 on a pulse of the ClkW 70. Furthermore, the signal 88 is input to the flip-flop 68 that outputs the signal 88 as signal 90 on a pulse of the ClkW 70.

The signals 84, 86, 88, and 90 are potential launched write signals that are input to selection circuitry 91. The selection circuitry 91 includes a NAND gate 92 that uses a minus0 signal 94 to control whether the signal 90 is to be passed through the NAND gate 92. Similarly, the selection circuitry 91 includes a NAND gate 96 that uses a minus1 signal 98 to control whether the signal 88 is to be passed through the NAND gate 96. Moreover, the selection circuitry 91 includes a NAND gate 100 that uses a minus2 signal 102 to control whether the signal 86 is to be passed through the NAND gate 100. Furthermore, the selection circuitry 91 includes a NAND gate 104 that uses a minus3 signal 106 to control whether the signal 84 is to be passed through the NAND gate 104. The minus0 signal 94, the minus1 signal 98, the minus2 signal 102, and the minus3 signal 106 are control signals that control which of the outputs 84, 86, 88, and 90 is passed to a NAND gate 108 to output the selected signals 84, 86, 88, or 90 as an output TrainWrStart signal 110 as the launched IWS. In other words, the minus0 signal 94 passes through the signal 90 at CWL (i.e., CWL-0). The minus1 signal 98 passes through the signal 88 at one cycle short of CWL (i.e., CWL-1). The minus2 signal 102 passes through the signal 86 at two cycles short of CWL (i.e., CWL-2). The minus3 signal 106 passes through the signal 84 at three cycles short of CWL (i.e., CWL-3). As discussed below, the minus0 signal 94, the minus1 signal 98, the minus2 signal 102, and the minus3 signal 106 are received from decoding circuitry that outputs the proper signal based on mode register values set for the memory device 10.

The IWS circuitry 49 also includes a gate 112 that, along with inverter 114, ensures that a pulse on the TrainedWrStartm4 signal 60 has a duration of least two cycles of the ClkW 70 before entering the flip-flops 62, 64, 66, and 68. The IWS circuitry 49 also may include one or more inverters 116 to ensure that the signals have proper logical polarity and/or sufficient power corresponding to loading of the signals.

Figure 3:
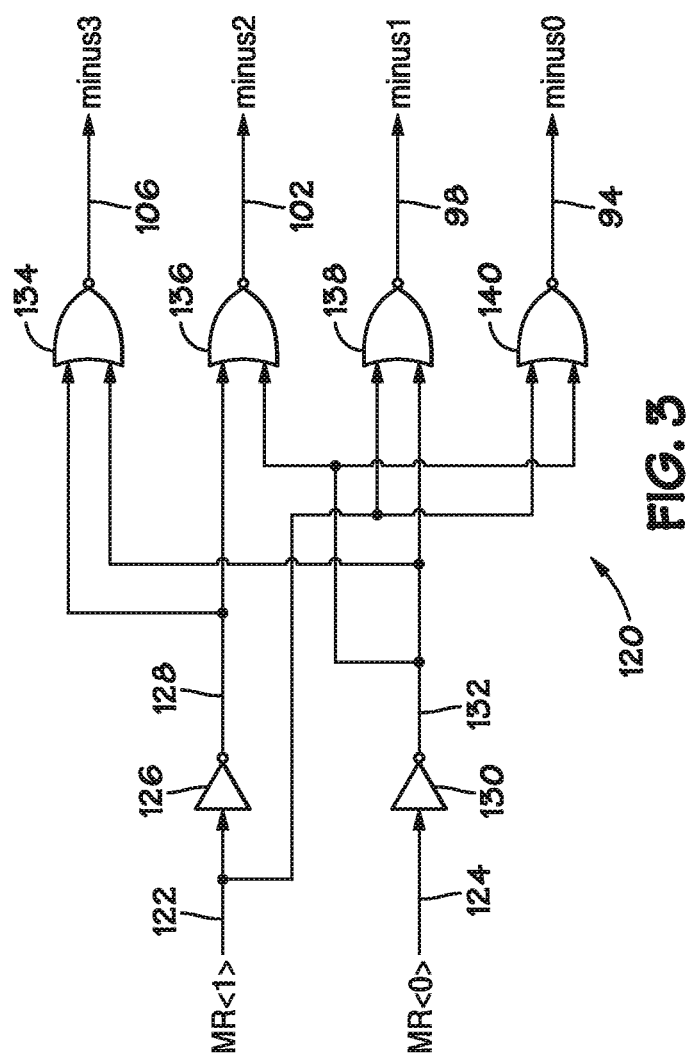
FIG. 3 is a schematic diagram of the decoder circuitry configured to decode signals used to control the IWS circuitry of FIG. 2, in accordance with an embodiment.

FIG. 3 illustrates a schematic diagram of an embodiment of decoder circuitry 120 that decodes a first mode register 122 and a second mode register 124 to generate the minus0 signal 94, the minus1 signal 98, the minus2 signal 102, and the minus3 signal 106. The decoder circuitry 120 includes an inverter 126 that generates a first register false signal 128 that is inverse to the first mode register 122. The decoder circuitry 120 also includes an inverter 130 that generates a second register false signal 132 that is inverse to the second mode register 124. The decoder circuitry 120 includes NOR gates 134, 136, 138, and 140 to decode the first and second mode registers 122 and 124. The NOR gate 134 receives the first register false signal 128 and the second register false signal 132. The NOR gate 136 receives the first register false signal 128 and the second mode register 124. The NOR gate 138 receives the first mode register 122 and the second register false signal 132. The NOR gate 140 receives the first mode register 122 and the second register false signal 132.

Figure 4:
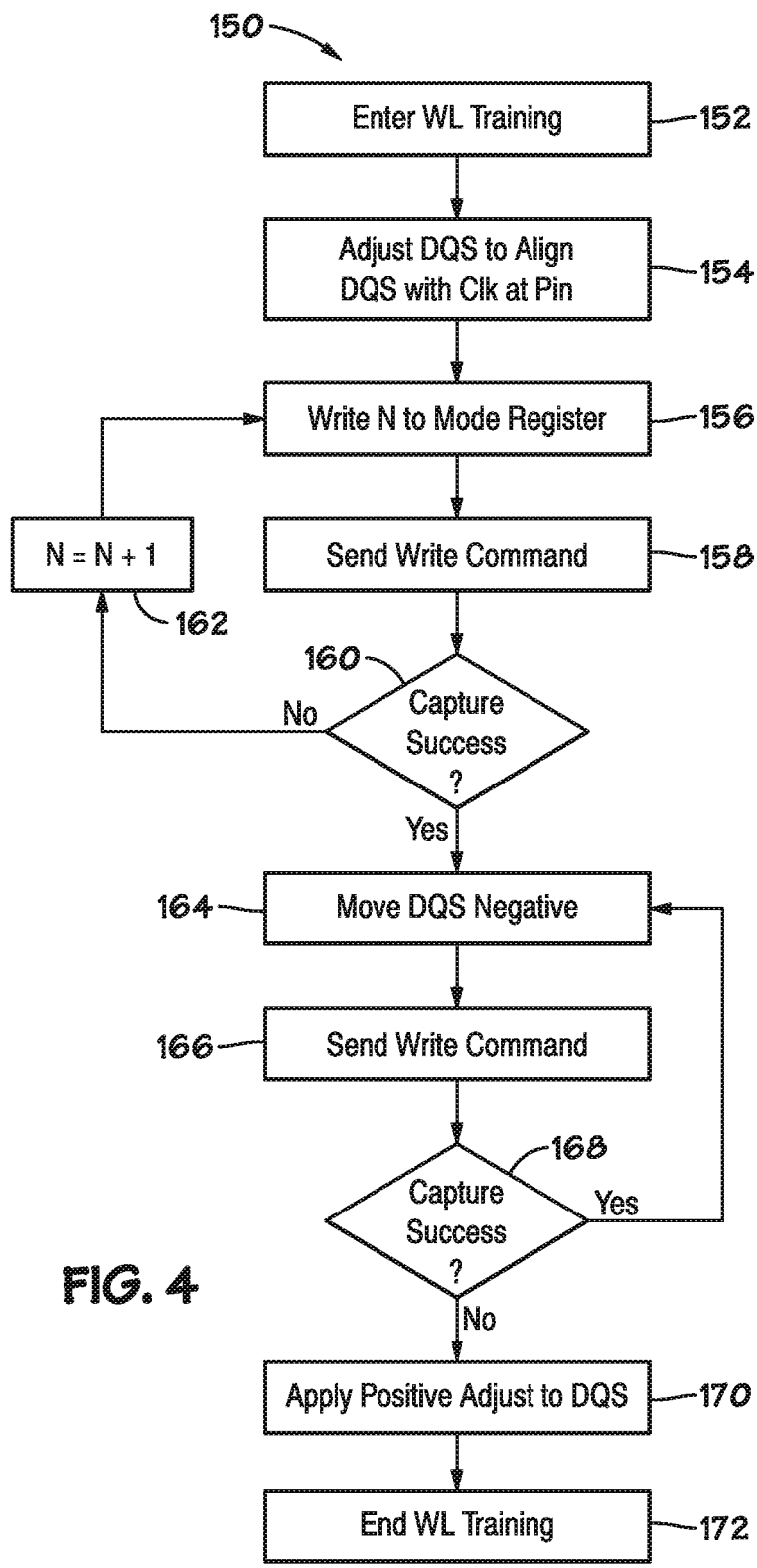
FIG. 4 is a flow diagram of a process used by a host device to perform write leveling, in accordance with an embodiment.

FIG. 4 is a flow diagram of a process 150 that may be employed by the controller 17 to perform write leveling with the memory device 10. In some embodiments, the process 150 may be executed by the controller 17 as a host device using instructions stored in non-transitory, tangible, and computer-readable memory and executed by the controller 17 to perform the steps of the process 150. The controller 17 starts write leveling training (block 152). For example, the controller 17 may write a bit to a mode register to cause the memory device to enter a write level training mode. To initiate the write leveling, the controller 17 first synchronizes DQS and clock signals at pins of the memory device 10. The controller 17 then adjusts the DQS signal that it provides to the memory device 10 (block 154). After this adjustment, the DQS signal should be aligned to the clock, both provided by the controller 17, at input pins of the memory device 10. In some embodiments, once DQS-to-Clk timing has been synchronized, the DQS-to-Clk timing is left fixed as is not varied for internal write leveling or fine tuning.

After the DQS-to-Clk timing has been set, the controller 17 performs internal write leveling to determine how many cycles earlier than CWL to fire the IWS. The controller 17 then writes a number (N) to a mode register as an indication of how soon the IWS circuitry 49 is to launch the IWS (block 156). For example, N may be selected to start at an initial number (e.g., 0) of cycles before CWL that the IWS is to be launched. The controller 17 then sends a write command to the memory device 10 (block 158). The controller 17 then determines whether the write command was captured properly (block 160). For example, the controller 17 may receive an indication from the memory device 10 that indicates whether the DQS was sufficiently aligned to capture the write command properly. If the command was not captured properly, the controller 17 increments N (block 162) then writes the new N to the mode register and re-attempts to capture the write command.

Once a write command has been captured properly, the controller 17 has found the proper N value to be used and internal write leveling has been completed. However, the controller 17 may also perform fine tuning to ensure DQS is aligned less than a cycle. As part of fine tuning, the controller 17 may move DQS negative (block 164). For example, the movement may be a minimum stepsize of the controller 17. After the DQS has been moved, the controller 17 sends a write command to the memory device 10 (block 166). The controller 17 then determines whether the capture was successful (block 168). For example, in some embodiments, the controller 17 may determine whether the capture was successful based on an indication from the memory device 10 whether the write command was captured properly. Since fine tuning looks for a failure edge, if the command was captured properly, the controller 17 moves the DQS more negative until a failure point is found. When the write command is not completed successfully, the controller 17 may shift the DQS in a positive direction (block 170). Since the controller 17 has found the failure edge, the controller 17 may shift DQS by 0.5 nCK to center the DQS and allow for DQS variation. Once external write leveling, internal write leveling, and fine tuning have been completed, the controller 17 ends write leveling (block 172).

Figure 5:
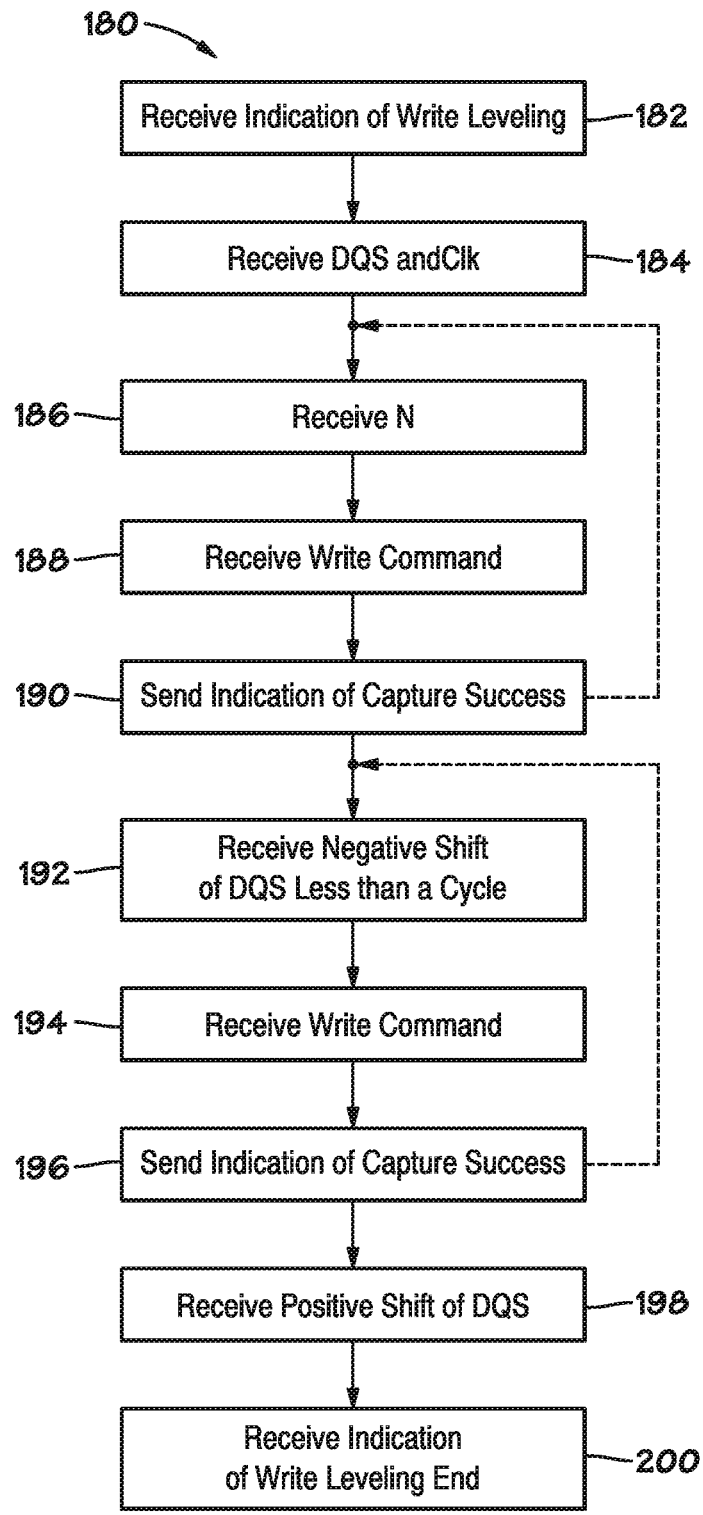
FIG. 5 is a flow diagram of a process used by a memory device to perform write leveling, in accordance with an embodiment.

FIG. 5 is a flow diagram of a process 180 that may be employed by the memory device 10 during the write leveling training of the controller 17. The memory device 10 receives an indication of write leveling (block 182). For example, the controller 17 may set a mode register (e.g., MR2.b1) to indicate that write leveling training mode is starting. During the write leveling training mode, the DQS signal and a Clk from the controller 17 (block 184). The controller 17 aligns the DQS signal and the Clk at respective pins of the memory device as part of external write leveling.

The memory device 10 receives a number N from the controller 17 (block 186). The number, N, indicates how many cycles before CWL at which the IWS is to be launched. For example, a value of 0 for N causes the IWS to be launched at full CWL. Moreover, in some embodiments, the controller 17 may write N to a mode register of the memory device 10 (e.g., MR13.b3:b0). After receiving N, the memory device 10 receives a write command from the controller 17 (block 188). As part of receiving the write command, the memory device 10 launches an IWS based on the value of N and the CWL. The memory device 10 then sends an indication of whether the IWS was captured successfully (i.e., IWS arrives with first edge of the DQS signal) using the DQS signal (block 190). If the IWS is not captured successfully, the processor 17 may rewrite N thereby the controller 17 returns the process 180 to block 186). However, if the IWS is captured successfully, the correct cycle has been identified. Thus, the internal leveling is deemed completed, and a fine tuning portion of write leveling is begun to identify a location within the cycle.

As part of fine tuning, the memory device 10 receives a negative shift of the DQS signal (block 192). In some embodiments, the DQS-to-Clk relationship may be maintained by moving both the DQS signal and the Clk together. Furthermore, the negative shift of the DQS signal may be less than a whole cycle of the DQS signal. For instance, the negative shift may be a minimum stepsize for the DQS signal by the controller 17. Fine tuning looks for the failure edge of the DQS signal. Accordingly, the memory device 10 receives a write operation as part of the fine tuning (block 194). As part of receiving the write operation, the IWS is captured properly with the DQS signal. The memory device 10 sends an indication to the controller 17 indicating whether the IWS was captured successfully (block 196). If the controller 17 determines that the IWS was captured successfully, it determines that the failure edge of the DQS signal has not been found. Accordingly, the controller 17 would then keep shifting the DQS signal in the same direction until the IWS is not captured successfully establishing a location within the DQS signal cycle for the failing edge. Once the IWS is not properly captured, the memory device receives a positive shift of the DQS signal away from the failing edge (block 198). For example, to move the DQS signal to a likely safe location, the controller 17 may shift the DQS signal in a positive location by 0.5 nCK. Once this positive shift has been received, write leveling has completed, and the memory device 10 may receive an indication of write leveling ending (block 200). For example, the mode register used to start the write leveling training mode may be reverted from the state set in block 182. Although the foregoing discusses finding a failing edge of capture using negative shifts of the DQS signal until failure followed by a positive shift to a safe location, the failing edge may additionally or alternatively be found by positive shifts of the DQS signal until failure followed by a negative shift to a safe location.

In some embodiments, write leveling may utilize walkback circuitry. As used herein, walkback refers to progressively timed clocks where each clock is a portion of a cycle faster (i.e., earlier in phase) than a previous clock. The walkback circuitry may be used to generate the TrainedWrStartm4 signal 60. However, walkback may be foregone because a slow output may be compensated for by using a larger value of N to launch the IWS sooner. However, a larger value of N and a slower output allows much more variation over voltage and temperature changes. Therefore, the walkback functionality provides less internal variation in the DRAM for the capture of the IWS by DQS. The walkback functionality also allows more room for external variation by the controller 17. Moreover, the walkback functionality gradually speeds up a shift clock to a fastest available input so that the TrainedWrStartm4 signal 60 has a small skew with respect to the external signals (e.g., CLK & the DQS signal).

Figure 6:
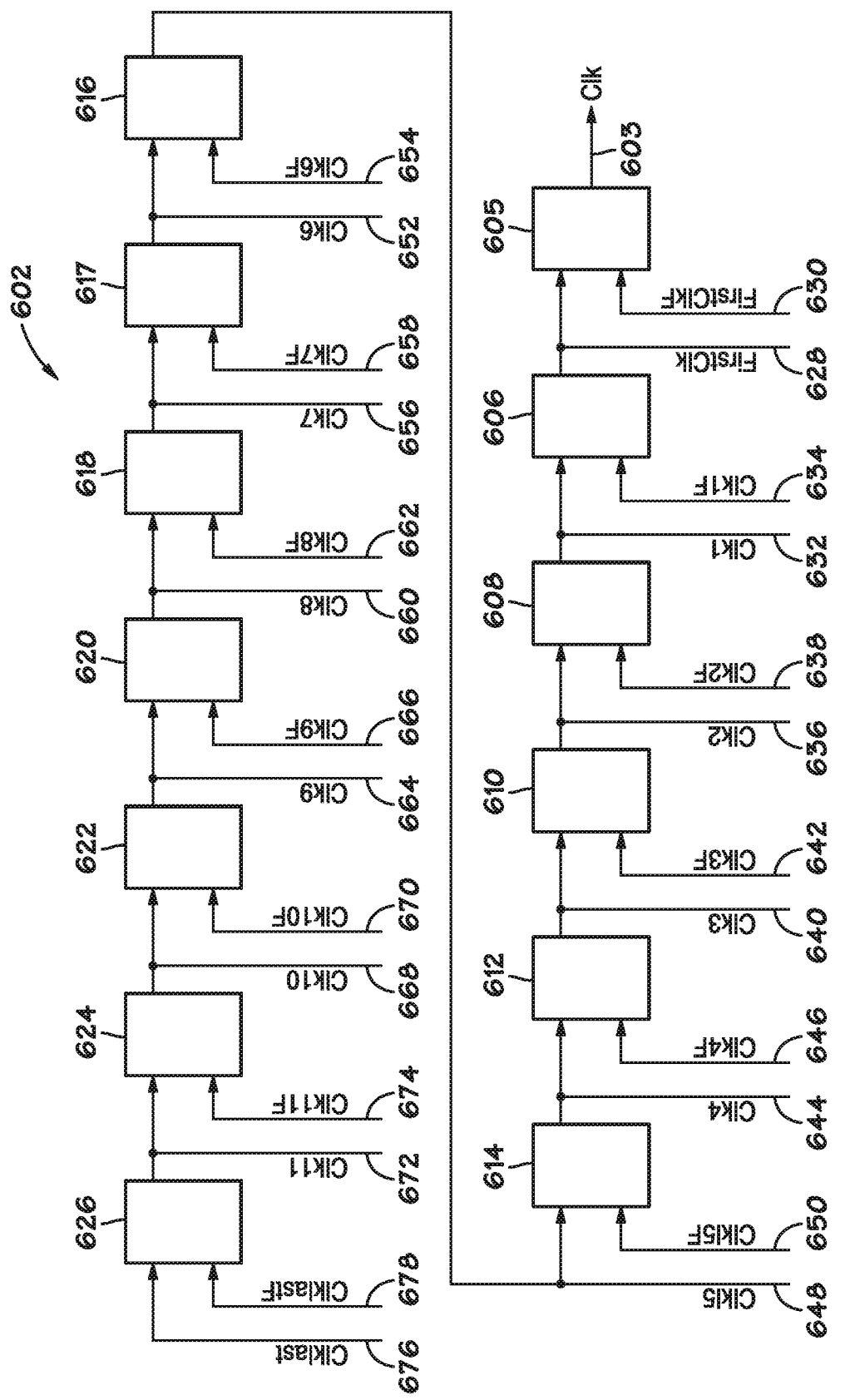
FIG. 6 illustrates a schematic diagram of walkback clock circuitry that may be used to generate walkback clocks used for write leveling, in accordance with an embodiment.

FIG. 6 illustrates a schematic of an embodiment of walkback clock circuitry 602 that may be used to generate walkback clocks for use by walkback circuitry used in the write leveling process. As illustrated, the walkback clock circuitry 602 includes latches 605, 606, 608, 610, 612, 614, 616, 617, 618, 620, 622, 624, and 626, collectively referred to as latches 605-626, that incrementally shift the clock 603 by a portion of a cycle through the latches 605-626. In other words, the latch 605 generates a fastclk 628 that is a shifted version of the clock 603 and generates a fastclkF 630 that is an inverted version of the fastclk 628. The latch 606 generates a clk1 632 that is a shifted version of the fastclk 628 and generates a clk1 632 that is an inverted version of the clk1 632. The latch 608 generates a clk2 636 that is a shifted version of the clk1 632 and generates a clk2F 638 that is an inverted version of the clk2 636. The latch 610 generates a clk3 640 that is a shifted version of the clk2 636 and generates a clk3F 642 that is an inverted version of the clk3 640. The latch 612 generates a clk4 644 that is a shifted version of the clk3 640 and generates a clk4F 646 that is an inverted version of the clk4 644. The latch 614 generates a clk5 648 that is a shifted version of the clk4 644 and generates a clk5F 650 that is an inverted version of the clk5 648. The latch 616 generates a clk6 652 that is a shifted version of the clk5 648 and generates a clk6F 654 that is an inverted version of the clk6 652. The latch 617 generates a clk7 656 that is a shifted version of the clk6 652 and generates a clk7F 658 that is an inverted version of the clk7 656. The latch 618 generates a clk8 660 that is a shifted version of the clk7 656 and generates a clk8F 662 that is an inverted version of the clk8 660. The latch 620 generates a clk9 664 that is a shifted version of the clk8 660 and generates a clk9F 666 that is an inverted version of the clk9 664. The latch 622 generates a clk10 668 that is a shifted version of the clk9 664 and generates a clk10F 670 that is an inverted version of the clk10 668. The latch 624 generates a clk11 672 that is a shifted version of the clk10 668 and generates a clk11F 674 that is an inverted version of the clk11 672. The latch 626 generates a Clklast 676 that is a shifted version of the clk11 672 and generates a ClklastF 678 that is an inverted version of the Clklast 676. Each of the clocks generated by the walkback clock circuitry 602 may be used by the walkback circuitry.

Figure 7:
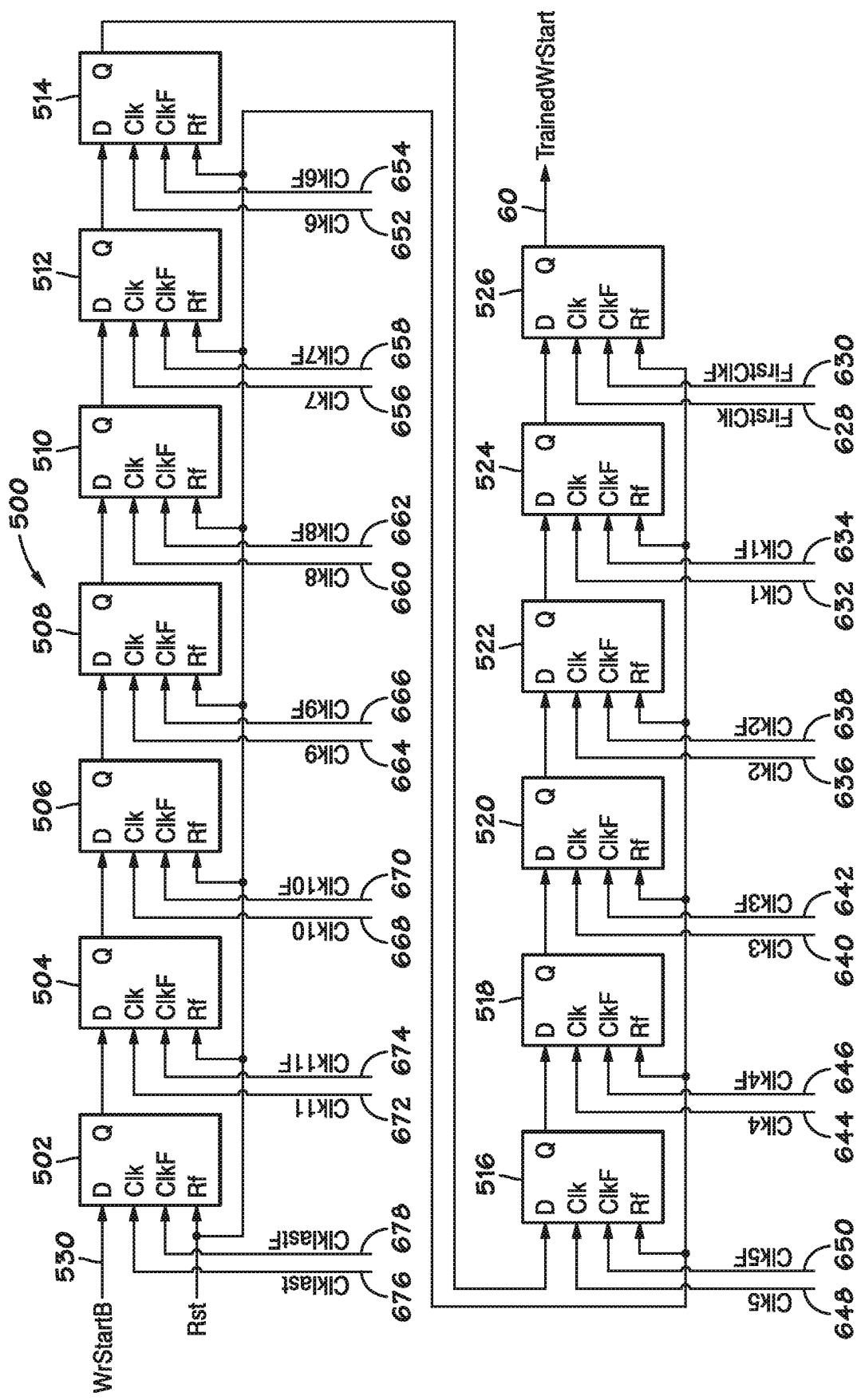
FIG. 7 is a schematic diagram of walkback circuitry that uses the walkback clocks of FIG. 6 and may be used in write leveling, in accordance with an embodiment.

FIG. 7 is a schematic diagram of an embodiment of a CWL shifter 500. A CWL shifter may be used to shift write commands through using one or more flip-flops to delay the write command by some number (e.g., programmed CWL) of clock cycles. The CWL shifter may incorporate the walkback circuitry 602 as part of the CWL shifter 500 and/or may use walkback for the entire CWL shifter. The CWL shifter 500 includes serially-connected flip-flops 502, 504, 506, 508, 510, 512, 514, 516, 518, 520, 522, 524, and 526, collectively referred to as flip-flops 502-526. The flip-flops 502-52 provide multiple stages. In the illustrated embodiment, there are 13 walkback clocks and stages, but any portion of the CWL shifter (e.g., up to 28 stages) may utilize walkback. Since the illustrated walkback circuitry 602 includes 13 stages, the walkback circuitry 602 receives a WrStartm13 signal 530 that is the write command shifted through the CWL shifter with 13 fewer cycles than CWL. The walkback circuitry 602 utilizes respective walkback clocks at each stage to shift write command through the walkback circuitry 602 rather than a single clock. In other words, each stage of the walkback circuitry 602 occurs sooner relative to a cycle of the clock 603 than a next stage occurs relative to a next cycle of the clock 603. Thus, walkback clocks used closer to the left of the walkback circuitry 602 are "slower" than walkback clocks used closer to the right end of the walkback circuitry 602. To provide walkback capability, the final stages of the walkback circuitry 602 are driven by the fastest clock signal (fastclk 628)

and each preceding stage is driven by a progressively delayed version of that clock signal. Until finally, at the beginning of this walkback circuitry, the clock timing has been slowed enough to closely align with the incoming (relatively slow) inputs that load into the start of the walkback circuitry 602. For example, a delay (e.g., 2 ns) may be included in the data that the clock 603 captures due to a command decoding delay that has slowed the clock 603. The slow edge (i.e., Clklast 676) of the walkback clocks 601 may be used to match the delays in the data.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a command interface configured to receive write commands from a host device;
an input-output interface configured to receive a data strobe from the host device; and
internal write circuitry configured to:
launch an internal write signal a number of clock cycles prior to a column address strobe write latency (CWL) based at least in part on the write commands, wherein timing of the launch of the internal write signal is based at least in part on an indication from the host device that indicates the number as an indication of when to launch the internal write signal relative to the CWL for the memory device, wherein the internal write signal is launched relative to the a data strobe signal; and
adjust the data strobe signal by:
incrementally shifting the data strobe signal in a first direction until a capture failure occurs; and
after the capture failure occurs, shifting the data strobe signal in a second direction by a half cycle, wherein the second direction is in an opposite direction of the first direction.

2. The memory device of claim 1, wherein the internal write circuitry comprises a plurality of flip-flops configured to shift an incoming write command output from a portion of a CWL shifter of the memory device.

3. The memory device of claim 2, wherein a number of the plurality of flip-flops corresponds to a maximum number of cycles before the CWL that the internal write signal can be launched using the internal write circuitry.

4. The memory device of claim 1, comprising receiving the indication from the host device.

5. The memory device of claim 4, wherein receiving the indication from the host device comprises receiving the indication at a mode register of the memory device.

6. The memory device of claim 1, wherein the internal write circuitry comprises a plurality of flip-flops, wherein each flip-flop of the plurality of flip-flops is configured to output a potential launched write signal.

7. The memory device of claim 6, wherein the internal write circuitry comprises selection circuitry configured to select a launched write signal from the potential launched write signals.

8. The memory device of claim 7, wherein the selection circuitry comprises a first stage of gates and a second stage of gates.

9. The memory device of claim 8, wherein the second stage of gates receives an output from each gate of the first stage of gates.

10. The memory device of claim 8, wherein each gate of the first stage of gates receives a respective potential launched write signal and a control signal.

11. The memory device of claim 10, wherein the internal write circuitry comprises decoder circuitry that is configured to decode the control signal from the indication.

12. A method, comprising:
outputting a clock;
outputting a data strobe signal;
synchronizing the clock and the data strobe signal at a pin of a memory device as an external write leveling operation;
determining a number of cycles to cause the memory device to launch an internal write signal as an internal write leveling operation to cause capture of the internal write signal at a location relative to the data strobe signal, wherein the number of cycles comprises the number of cycles shorter than a column address strobe write latency (CWL) duration for the memory device;
sending the number of cycles to the memory device; and
adjusting the data strobe signal by less than a cycle as a fine adjustment, wherein the fine adjustment comprises:
incrementally shifting the data strobe signal in a first direction until a capture failure occurs; and
after the capture failure occurs, shifting the data strobe signal in a second direction by a half cycle, wherein the second direction is in an opposite direction of the first direction.

13. The method of claim 12, wherein the location comprises a first edge of the data strobe signal.

14. The method of claim 12, wherein determining the number of cycles comprises:
receiving an indication of whether a write command was successfully captured; and
if the write command was successfully captured, determining the number based on the successful capture of the write command.

15. The method of claim 14, wherein determining the number of cycles comprises, for each unsuccessful capture of the write command:
resend the write command;
receiving an indication of whether the resent write command was successfully captured; and if the resent write command was successfully captured, determining the number based on the successful capture of the resent write command.

16. The method of claim 12, wherein the first direction comprises a negative-shift direction and the second direction comprises a positive-shift direction.

17. A method comprising:
receiving, at a memory device and from a host device, a first write command;
capturing the first write command in the memory device;
from the memory device to the host device, sending an indication that the first write command is captured successfully;
receiving, at the memory device and from the host device, a second write command using a first shifted data pulse from the host device;
attempting to capture the second write command in the memory device;
sending an indication that the attempt to capture the second write command has failed; and
in response to the second write command capture failure, receiving, at the memory device and from the host device, a third write command using a second shifted data pulse from the host device, wherein the first and second shifted data pulses are shifted in opposite directions.

18. The method of claim 17, comprising:
sending an indication that the first write command has not been captured successfully when attempting to capture the first write command fails; and
re-receiving the first write command one or more times until the first write command is successfully captured.

19. The method of claim 17, comprising:
sending an indication that the second write command has been captured successfully when attempting to capture the second write command succeeds; and
receiving one or more subsequent write commands until the third write command is successfully captured, wherein the one or more subsequent write commands comprises the third write command.

* * * * *